(12) United States Patent
Zhang et al.

(10) Patent No.: US 9,923,136 B2
(45) Date of Patent: Mar. 20, 2018

(54) HIGH TEMPERATURE SENSORS AND TRANSDUCERS

(71) Applicant: The Penn State Research Foundation, University Park, PA (US)

(72) Inventors: Shujun Zhang, State College, PA (US); Thomas R. Shrout, Furnace, PA (US); Chuanying Shen, State College, PA (US)

(73) Assignee: The Penn State Research Foundation, University Park, PA (US)

( * ) Notice: Subject to any disclaimer, the term of this patent is extended or adjusted under 35 U.S.C. 154(b) by 450 days.

(21) Appl. No.: 14/702,847

(22) Filed: May 4, 2015

(65) Prior Publication Data

US 2015/0340591 A1 Nov. 26, 2015

Related U.S. Application Data

(60) Provisional application No. 61/989,574, filed on May 7, 2014.

(51) Int. Cl.
*H01L 41/187* (2006.01)
*H01L 41/18* (2006.01)
(Continued)

(52) U.S. Cl.
CPC ............. *H01L 41/18* (2013.01); *G01H 11/08* (2013.01); *G01L 1/16* (2013.01); *G01P 15/09* (2013.01);
(Continued)

(58) Field of Classification Search
CPC .... H01L 41/18; H01L 41/113; H01L 41/1132; H01L 41/187; G01H 11/08; G01L 1/16; G01P 15/09
(Continued)

(56) References Cited

U.S. PATENT DOCUMENTS 4,333,842 A 6/1982 Ito et al.
4,675,959 A * 6/1987 Sprout .................. H01G 7/023
264/435
(Continued)

*Primary Examiner* — Thomas Dougherty
(74) *Attorney, Agent, or Firm* — Dinsmore & Shohl LLP

(57) ABSTRACT

A high temperature piezoelectric sensor device such as a high temperature accelerometer, force sensor, pressure sensor, temperature sensor, acoustic sensor and/or acoustic transducer for use at temperatures up to 1000° C. The high temperature device includes a base, a piezoelectric element attached to the base and a pair of electrodes in electrical communication with the piezoelectric element. The piezoelectric element can have a $d_{15}$ piezoelectric coefficient between 16.0-18.0 pC/N for all temperatures between 25 to 700° C., and a rotated $d_{33}$ piezoelectric coefficient of 8.0-9.5 pC/N with zero face shear/thickness shear piezoelectric coefficients $d_{34}$, $d_{35}$ and $d_{36}$ in the same temperature range. The piezoelectric element can also have an electromechanical coupling factor $k_{15}$ variation of less than 7%, and $d_{15}$ and rotated $d_{33}$ piezoelectric coefficient variations of less than 5% for temperatures between 25 to 700° C. The piezoelectric element can have high electrical resistivity, being on the order of $>10^7$ Ω·cm at 600° C. The piezoelectric element can be an $A_2BC_2O_8$ piezoelectric material with a Fresnoite structure and A=Ca, Sr, Ba, Mg; B=Ti, Zr, Hf, V; and C=Si, Ge, Sn.

9 Claims, 6 Drawing Sheets

(51) Int. Cl.
*H01L 41/113* (2006.01)
*G01H 11/08* (2006.01)
*G01P 15/09* (2006.01)
*G01L 1/16* (2006.01)

(52) U.S. Cl.
CPC ........ *H01L 41/113* (2013.01); *H01L 41/1132* (2013.01)

(58) Field of Classification Search
USPC ....... 310/358; 252/62.9 PZ, 62.9 R; 501/134
See application file for complete search history.

(56) References Cited

U.S. PATENT DOCUMENTS

| | | | | |
|---|---|---|---|---|
| 7,622,851 | B2* | 11/2009 | Zhang | ................... H01L 41/18 310/358 |
| 2007/0164630 | A1* | 7/2007 | Zhang | ................... H01L 41/18 310/311 |
| 2008/0134795 | A1* | 6/2008 | Zhang | ................. C01G 29/006 73/723 |
| 2011/0133608 | A1* | 6/2011 | Fukuoka | ............... C04B 35/475 310/365 |
| 2013/0229091 | A1* | 9/2013 | Yu | ....................... H01L 41/1132 310/367 |
| 2013/0291729 | A1* | 11/2013 | Baer | .................. B01D 53/228 96/12 |

* cited by examiner

HIGH TEMPERATURE SENSORS AND TRANSDUCERS

RELATED APPLICATION

This application claims priority to U.S. Provisional Patent Application Ser. No. 61/989,574 filed on May 7, 2014, which is incorporated herein by reference in its entirety.

FIELD OF THE INVENTION

The instant application is related to sensors and transducers, and in particular to sensors and transducers that use a high temperature piezoelectric material.

BACKGROUND OF THE INVENTION

High temperature sensors such as pressure sensors, gas sensors, accelerometers, acoustic sensors, etc., are critical for advanced industrial, automotive and aerospace sensing applications with typical temperatures for these applications ranging from 200 to 1000° C., and above. As such, the need for electronic systems, including sensors to monitor noise, vibration, and acoustic emissions at high temperatures is known. The need for actuators, such as linear positioning systems, nano-positioning systems, etc., that can operate at high temperatures is also known.

Sensing can be accomplished by a wide variety of commercially available devices, including: piezoelectric sensors; strain gauges; piezoresistive sensors, capacitive sensors, to name a few. Of the several sensing mechanisms available, piezoelectrics are the most prevalent due to their simplicity of design, integration and high sensitivity over a broad range of frequencies and temperature.

It is appreciated that piezoelectric sensors not only develop a charge for an applied stress or strain, but also maintain such a charge for a period of time long enough to be detected by the electronic system. It is also appreciated that the length of time the charge is maintained is proportional to the RC time constant. Furthermore, the minimum useful frequency of a sensor, known as the lower limiting frequency ($f_{LL}$), is inversely proportional to the RC time constant and below $f_{LL}$ the charge will drain off before it can be detected as a result of conduction in the sensor. Finally, with a low $f_{LL}$, the dynamic bandwidth can be extended into the audio frequency range; thus, a large RC constant (especially, high electrical resistivity at an elevated temperature) is desirable.

A broad range of ferroelectric and nonferroelectric piezoelectric crystals for sensors have been investigated. For example, FIG. 1 summarizes sensitivity versus maximum usage temperature for various prior art piezoelectric materials based, which are briefly discussed below. In addition, the maximum usage temperature shown in FIG. 1 is based on a material's Curie temperature, melting temperature, phase transition temperature and/or proposed electrical resistivity of $10^6$ Ohm·cm, though materials with lower electrical resistivity may still be functional in different applications, for example with high frequency sensing applications.

The relaxor-$PbTiO_3$ ferroelectric single crystals (labeled Perovskite Crystals) have a perovskite structure and are found to possess the highest piezoelectric properties with $d_{33}$ and $d_{15}$ values on the order of >2000 pC/N. However, their usage temperature range is limited by low ferroelectric phase transitions $T_{RT}$ (<120° C.) with a correspondingly strong temperature dependence.

Perovskite polycrystalline ceramics (labeled Perovskite Ceramics), such as $Pb(Mg_{1/3}Nb)O_3$—$PbTiO_3$ (PMNT), $Pb(Zr,Ti)O_3$ (PZT) and $BiScO_3$—$PbTiO_3$ (BSPT), have sensitivities in the range of 100 pC/N to 1000 pC/N, with a usage temperature range of 80-350° C. The usage temperature range is restricted by thermally activated aging at temperatures far below their Curie temperatures, above which they suffer depolarization and complete loss of piezoelectric activity.

Ferroelectric materials with the tungsten bronze structure (labeled Tungsten Bronze) and Aurivillius structure (labeled BLSF) possess modest piezoelectric properties. For example, sensitivities range from 10 pC/N to 100 pC/N for usage temperatures up to 600° C., which is limited by their respective Curie temperatures and/or low electrical resistivities. It should be noted that though lithium niobate (labeled LN) crystals possess a Curie temperature of 1150° C., their low resistivities and oxygen loss at elevated temperatures restrict applications to less than 600° C., however operational temperature ranges can be much wider for high frequency usage.

In general, nonferroelectric piezoelectric single crystals possess low sensitivities, e.g. falling in the range of 1-20 pC/N (see Table 1 below). However, their ultralow mechanical and dielectric losses, and high electrical resistivities, make them ideal candidates for high temperature sensing applications. Also, the usage temperature range of piezoelectric crystals may be limited by α-β phase transitions, the melting point and/or low electrical resistivity at ultrahigh temperature. In addition, the low symmetry results in undesirable cross-talk and pyroelectric effects that may dominate the response signal.

TABLE 1

| Materials | Growth method | Cost | symmetry | $d_{eff}$ (pC/N) | $k_{eff}$(%) | $\epsilon_r$ | $\rho(\Omega \cdot cm)$ @600° C. | Comments |
|---|---|---|---|---|---|---|---|---|
| Tourmaline | Mineral | Low | 3 m | 1.8-3.6 | 9-11 | 7.5-8.2 | $10^8$ | Mineral |
| AlN | sublimation | / | 6 mm | 5.6 | / | ~12 | / | Oxidization |
| α-$SiO_2$ | hydrothermal | Low | 32 | 2.3 | 8 | 4.5 | / | α-β transition |
| $GaPO_4$ | hydrothermal | High | 32 | 4.5 | 16 | 6.1 | $10^9$ | α-β transition |
| LGS | Cz/Bridgman | High | 32 | 6.2 | 16 | 19.2 | $10^6$ | Disorder structure |
| LGT | Cz/Bridgman | High | 32 | 6.4 | 16 | 19.6 | $>10^6$ | Disorder structure |
| CTGS | Cz/Bridgman | High | 32 | 4.6 | 12 | 18.2 | $10^8$ | Low piezoelectric |
| YCOB | Cz/Bridgman | Low | m | 3-10 | 6-22 | 12.0 | $>10^9$ | Low symmetry |
| NdCOB | Cz/Bridgman | Low | m | 11-16 | 19-31 | 55.5 | $10^8$ | Low symmetry |

LGS: $La_3Ga_5SiO_{14}$ with disordered structure;
LGT: $La_3Ga_{5.5}Ta_{0.5}O_{14}$ with disordered structure;
CTGS: $Ca_3TaGa_3Si_2O_{14}$ with ordered structure.

Quartz α-$SiO_2$ is the best known piezoelectric material and is widely used in electronic devices, such as oscillators, resonators and filters. Originally, natural quartz crystals were employed, but now have been widely replaced by hydrothermally grown synthetic quartz. Quartz possesses excellent electrical resistivity (>$10^{17}$ Ω·cm at room temperature) and ultralow mechanical loss (high mechanical $Q_M$), narrow bandwidth and temperature-stability, thus making it the material of choice in telecommunication equipment. However, disadvantages of quartz include relatively small piezoelectric coefficients ($d_{11}$~2.3p C/N) and a low α-β phase transition temperature at 573° C., which is further limited by mechanical (ferrobielastic) twinning that occurs at 300° C. Tourmaline is a natural mineral with a complex aluminum-borosilicate composition and a large variation in electrical resistivity. The piezoelectric coefficient $d_{33}$ is reported to be 1.8 pC/N. Tourmalines have the advantage over quartz of no twining or phase change prior to their respective melting points, and have been commercialized for pressure or vibration sensors at temperatures less than or equal to 6000° C. However, tourmaline belongs to 3 m symmetry, which shows strong pyroelectric effects. In addition, with tourmaline being a natural mineral, the quality is depended on various sources and attempts to artificially grow tourmaline crystals with usable size have proven unsuccessful.

Gallium orthophosphate ($GaPO_4$) is a quartz analogue that belongs to the 32 symmetry and shows no pyroelectric effect. Gallium orthophosphate shares many of the positive features of quartz, such as high electrical resistivity, high mechanical quality factor and temperature stability up to 970° C. where an α-β phase transition occurs. However, the piezoelectric coefficient is only 4.5 pC/N and the material is further limited by the high production costs.

The langasite family of crystals belongs to the trigonal system (point group 32), is not pyroelectric and have a general formula of $A_3BC_3D_2O_{14}$. Langasite—$La_3Ga_5SiO_{14}$ (LGS), and its isomorphs, such as langatate—$La_3Ga_{5.5}Ta_{0.5}O_{14}$ (LGT), can be readily grown and have been widely commercialized for pressure sensors and accelerometers with moderate piezoelectric coefficients of 6-7 pC/N. However, their usage temperature is less than or equal to 600° C. due to their crystal structures being disordered, which results in incoherent phonon scattering, increased the acoustic friction and greatly decreased electrical resistivity. On the other hand, the langasite crystals with ordered structure, such as $Ca_3TaGa_3Si_2O_{14}$, show much higher resistivity, but with relatively low piezoelectric coefficient of 4.6 pC/N.

Oxyborate crystals, with the general formula $ReCa_4O(BO_3)_3$ (Re=rare earth element, abbreviated ReCOB) can be readily grown from the melt using the Czochralski (CZ) at around 1500° C. Analogous to langasite crystals, their potential temperature usage range is expanded due to no phase transition(s) occurring prior to their melting points. As such, oxyborate crystals can possess ultrahigh electrical resistivity at elevated temperatures, and high temperature stability of piezoelectric and electromechanical properties. For example, piezoelectric coefficients can be on the order of 3-16 pC/N, depending on the crystal orientations (cuts) and vibration modes. However, due to the low monoclinic symmetry (point group m), optimized crystal cuts to minimize the cross-talk and pyroelectric effect is problematic.

Given the above, it is apparent that improved sensors for use at high temperatures are needed. Therefore, high temperature sensors using a piezoelectric material that can be used at high temperatures, exhibit minimum cross-talk, and have low manufacturing costs would be desirable.

SUMMARY OF THE INVENTION

High temperature piezoelectric sensor devices such as high temperature accelerometers, force sensors, temperature sensors, acoustic sensors and transducers are provided. In some instances, the high temperatures devices can be used at temperatures up to 1000° C. The high temperature devices include a base, a piezoelectric element attached to the base and a pair of electrodes in electrical communication with the piezoelectric element. The piezoelectric element can have a rotated $d_{33}$ piezoelectric coefficient between 8.0-9.9 pC/N for all temperatures between 25 to 700° C., with $d_{15}$ coefficient between 16.0-18.0 pC/N for all temperatures between 25 to 700° C. The piezoelectric element can also have a rotated $d_{33}$ and $d_{15}$ piezoelectric coefficient variations of less than 5% for temperatures between 25 to 700° C.

The piezoelectric element can be an $A_2BC_2O_8$ piezoelectric material with a Fresnoite structure. The piezoelectric element can also be in the form of a single crystal and have a chemical stoichiometry of $(Sr_{2x}Ba_{2(1-x)})(Ti_yZr_{(1-y)})(Si_{2z}Ge_{2(1-z)})O_8$, where x is in the range of 0≤x≤1, y is in the range of 0≤y≤1 and z is in the range of 0≤z≤1. In some instances, additional doping of the piezoelectric material with Ca and/or Mg on the A sites, Hf and V on the B sites, and Sn on the C sites can be included. Stated differently, the piezoelectric element can be made from a single crystal having a chemical stoichiometry of $A_2BC_2O_8$ where A=Ca, Sr, Ba and/or Mg; B=Ti, Zr, Hf and/or V; and C=Si, Ge and/or Sn.

In one embodiment, a $Ba_2TiSi_2O_8$ single crystal piezoelectric element has an X-axis electrical resistivity greater than 1.0×$10^7$ Ω·cm and a Z-axis electrical resistivity greater than 1.0×$10^9$ Ω·cm at 600° C. Also, the $Ba_2TiSi_2O_8$ single crystal has a $\in_{11}^T/\in_0$ dielectric constant greater than 16.5 and a $\in_{33}^T/\in_0$ dielectric constant greater than 10.8 at room temperature, with minimal variation up to 700° C. The dielectric loss along the X-axis is less than 1% for temperatures between 25 to 600° C. and less than 4% along the rotated Z-axis for temperatures between 25 to 700° C. at a frequency of 100 kHz.

In another embodiment, the piezoelectric element is a specific cut of a $Ba_2TiSi_2O_8$ single crystal that exhibits reduced cross-talk with other vibration modes. For example, the piezoelectric element can be a ZXl43°/ZXl37° or ZYl43°/ZYl137° cut with a $d_{33}$ piezoelectric coefficient on the order of 8.5 pC/N and zero face shear/thickness shear vibration modes $d_{34}$, $d_{35}$ and $d_{36}$.

DETAILED DESCRIPTION OF THE INVENTION

A high temperature piezoelectric sensor device, is provided. In some instances, the high temperature device can be an accelerometer, force sensor, pressure sensor, temperature sensor, acoustic sensor or acoustic transducer used at temperatures up to 1000° C. The high temperature device includes a base, a piezoelectric element attached to the base and a pair of electrodes in electrical communication with the piezoelectric element. The piezoelectric element can have a rotated $d_{33}$ piezoelectric coefficient between 8.0-9.5 pC/N for all temperatures between 25 to 700° C. and/or a $d_{15}$ piezoelectric coefficient between 16.0-18.0 pC/N for all temperatures between 25 to 700° C. The piezoelectric element can also have an electromechanical coupling factor $k_{15}$ variation of less than 7% and a $d_{15}$ and/or rotated $d_{33}$ piezoelectric coefficient variations of less than 5% for temperatures between 25 to 700° C.

In some instances, the piezoelectric element is a single crystal with the Fresnoite crystal structure and has a general formula of $A_2BC_2O_8$ with A=Ca, Sr, Ba, Mg; B=Ti, Zr, Hf, V and C=Si, Ge, Sn, and the combination there of. The piezoelectric element can be made from a material having the formula $(Sr_{2x}Ba_{2(1-x)})(Ti_yZr_{(1-y)})(Si_{2z}Ge_{2(1-z)})O_8$ where x is in the range of $0 \leq x \leq 1$, y is in the range of $0 \leq y \leq 1$ and z is in the range of $0 \leq z \leq 1$. In some instances, x is in the range of $0.01 \leq x \leq 0.1$, y is in the range of $0.1 \leq y \leq 0.9$ and z is in the range of $0.1 \leq z \leq 0.9$. In addition, large and high quality crystals of the material can be manufactured.

In one embodiment, Fresnoite-type $Ba_2TiSi_2O_8$ (BTS) single crystals can be provided, i.e. x=0, y=1, and z=0. It is appreciated that the BTS single crystals belong to P4bm symmetry with a high melting point of 1445° C. In addition, the crystals show advantages over other non-ferroelectric piezoelectric crystals, illustratively including a relatively high thickness shear piezoelectric coefficients (dis) on the order of ~17.5 pC/N.

Figure 1:
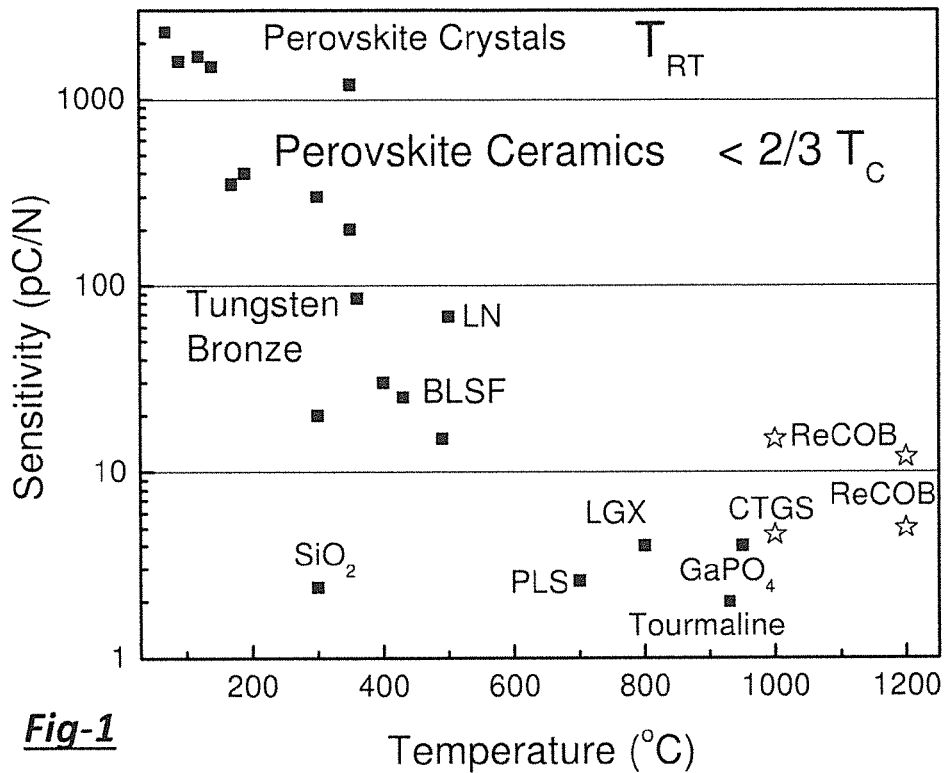
FIG. 1 is a graphical plot of sensitivity versus maximum usage temperature for various prior art piezoelectric element materials.
Figure 2:
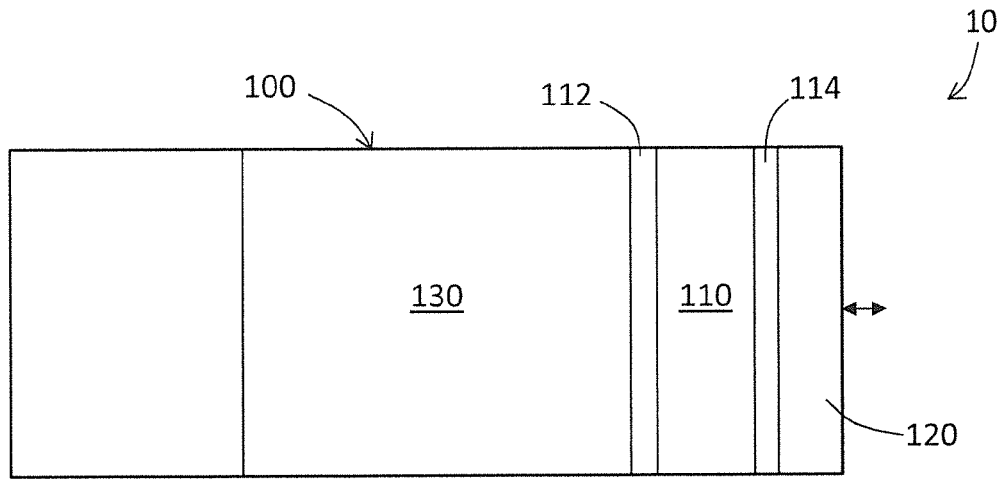
FIG. 2 is a schematic illustration of a high temperature device according to an embodiment disclosed herein.

Turning now to FIG. 2, a schematic illustration of a high temperature device in the form of a sensor or actuator is shown generally at reference numeral 10. The device 10 has a housing 100 and piezoelectric element 110. A pair of electrodes 112 and 114 are in contact with the piezoelectric element 110 as is known to those skilled in the art. An optional diaphragm, seismic mass, cover or nose 120 can be adjacent to the piezoelectric element 110, as can be a base 130.

A force applied to the optional diaphragm, cover or nose 120, or acceleration of the seismic mass 120 and thus an inertia force from the mass 120, can be transferred to the piezoelectric element 110, which in turn causes the element 110 to generate charge. The magnitude of the electric charge is proportional to the magnitude of applied force through the piezoelectric effect. Such an operation can be used in devices such as accelerometers, force sensors (load cells) and the like. In the alternative, an electric voltage can be applied to the piezoelectric element 110, which in turn causes the element 110 to change shape. Such an operation can be used in devices such as acoustic transducers and the like.

Room temperature and elevated temperature physical properties of $Ba_2TiSi_2O_8$ single crystals were determined. For example, Table 2 provides room temperature physical properties of BTS crystals. In addition, due to the high thickness shear piezoelectric $d_{15}$ value, maximized longitudinal piezoelectric $d_{33}$ coefficients on the order of 8.5-9.5 pC/N can be achieved for rotated Z cut samples.

TABLE 2

| Relative Dielectric Permittivities $\in^T_{ii}$ | |
|---|---|
| $\in^T_{11}$ | $\in^T_{33}$ |
| 16.5 | 10.8 |

| Elastic Compliance Constants $s^E$ (pm²/N) | | | | | |
|---|---|---|---|---|---|
| $s^E_{11}$ | $s^E_{12}$ | $s^E_{13}$ | $s^E_{33}$ | $s^E_{55}$ | $s^E_{66}$ |
| 7.5 | −1.2 | −3.0 | 13 | 32.2 | 14.2 |

| Elastic Stiffness Constants $c^E$ ($10^{10}$ N/m²) | | | | | |
|---|---|---|---|---|---|
| $c^E_{11}$ | $c^E_{12}$ | $c^E_{13}$ | $c^E_{33}$ | $c^E_{55}$ | $c^E_{66}$ |
| 15.9 | 4.4 | 4.7 | 9.9 | 3.1 | 7.0 |

| Electromechanical Coupling Factors $k_{ij}$ (%) | | | |
|---|---|---|---|
| $k_{15}$ | $k_{31}$ | $k_{33}$ | $k_t$ |
| 25.5 | 10.1 | 11.4 | 16.2 |

| Piezoelectric Coefficients $d_{ij}$ (pC/N) and $e_{ij}$ (C/m²) | | | | | |
|---|---|---|---|---|---|
| $d_{15}$ | $d_{31}$ | $d_{33}$ | $e_{15}$ | $e_{31}$ | $e_{33}$ |
| 17.5 | 2.7 | 4.0 | 0.54 | 0.74 | 0.65 |

Figure 3:
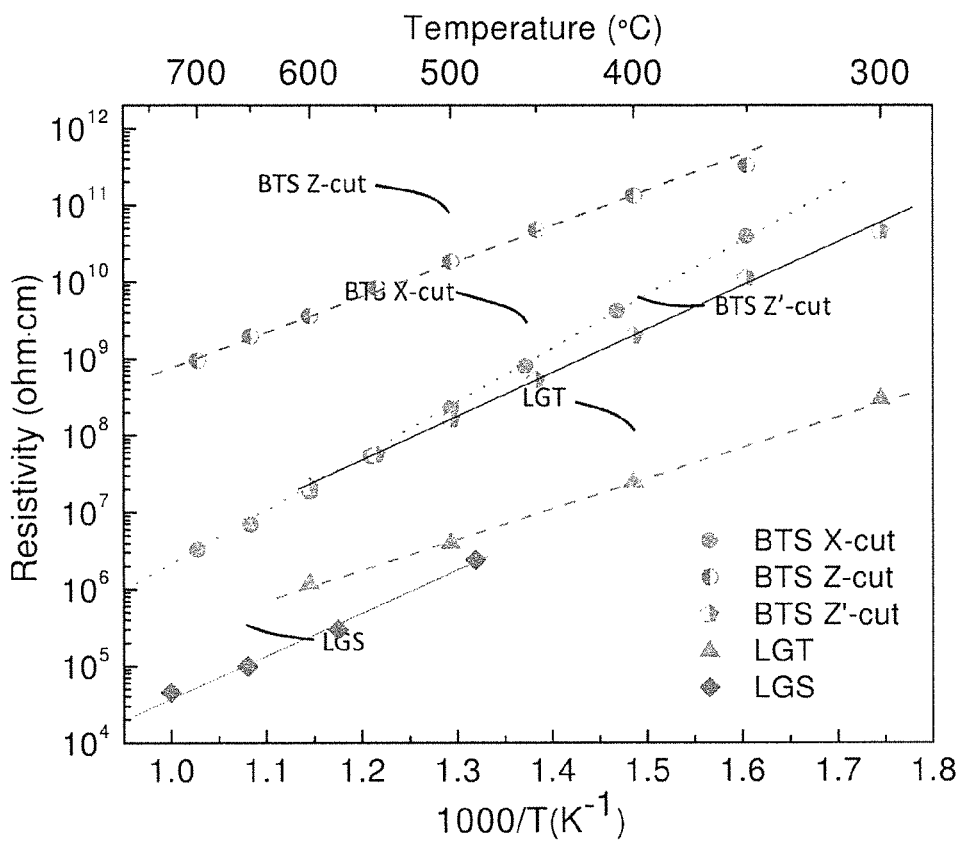
FIG. 3 is a graphical plot illustrating DC electrical resistivity versus temperature for $Ba_2TiSi_2O_8$ single crystals according to an embodiment disclosed herein and in comparison with other high-temperature piezoelectric crystals.

Regarding use of the high temperature device at elevated temperatures, FIG. 3 illustrates DC electrical resistivity versus temperature for BTS crystals in comparison with other high-temperature piezoelectric crystals. The curves in FIG. 3 show the expected linear Arrhenius behavior. Also, the electrical resistivities of BTS crystals along X- and Z-axes at 600° C. were found to be on the order of $1.9 \times 10^7$ and $3.6×10^9$ Ω·cm, respectively, and are much higher than the values of LGT ($1×10^6$ Ω·cm) and LGS ($3×10^5$ Ω·cm) crystals at the same temperature. The high electrical resistivity of $Ba_2TiSi_2O_8$ along the Z-direction is attributed to the layer crystal structure, where Ba and O act as an insulating network and the conductivity along the Z-direction is lower than that of along the X-direction.

Figure 4A:
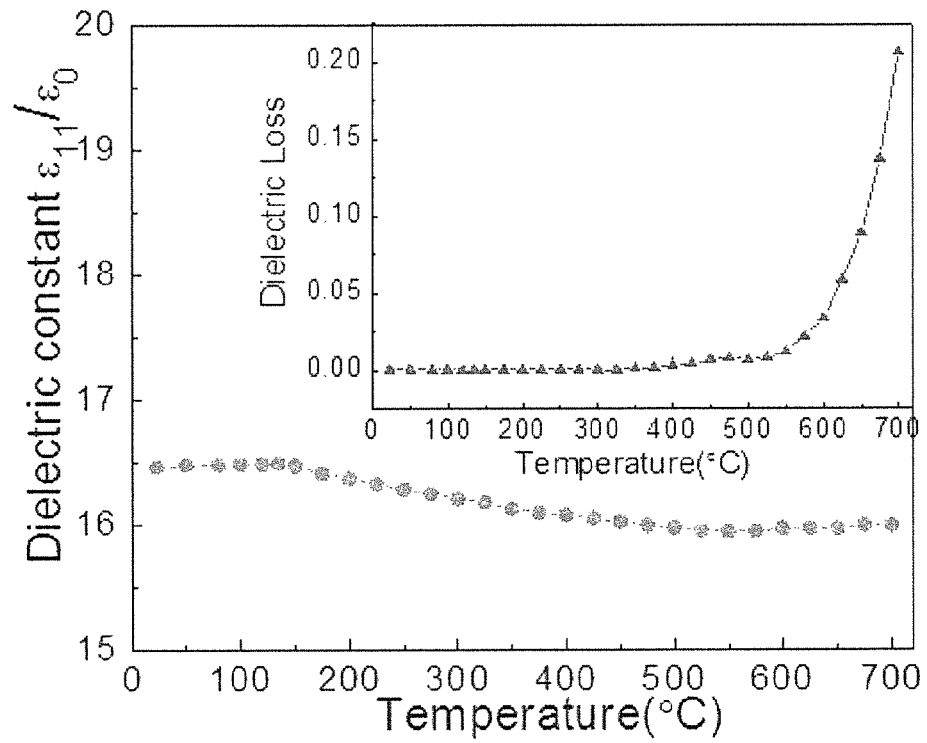
FIG. 4A is a graphical plot illustrating the dielectric behavior as a function of temperature measured at 100 kHz for $Ba_2TiSi_2O_8$ single crystals according to an embodiment disclosed herein along the X-axis.
Figure 4B:
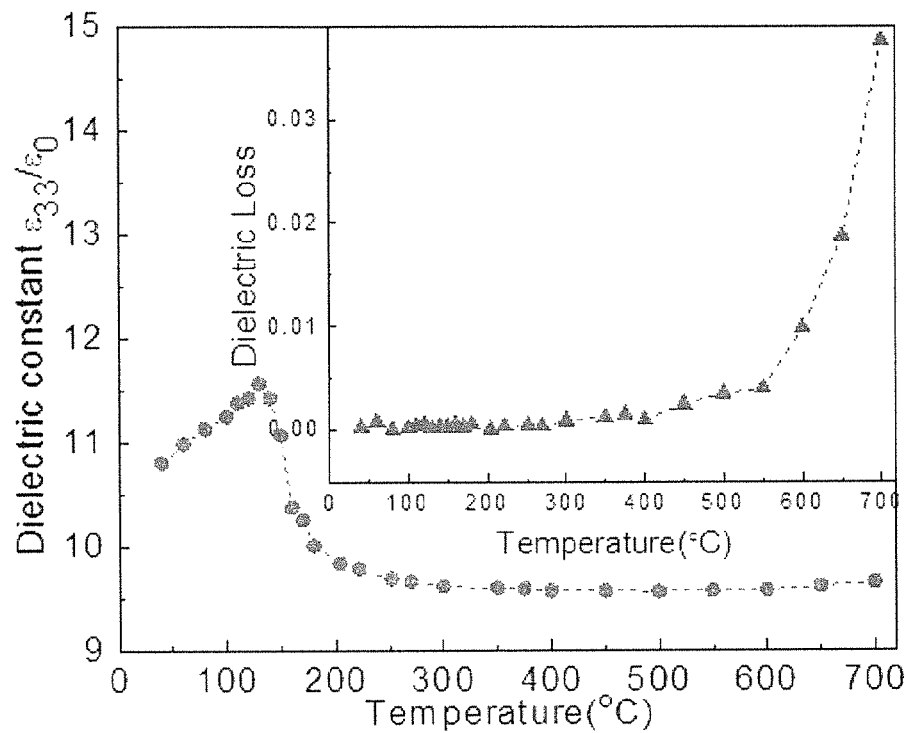
FIG. 4B is a graphical plot illustrating the dielectric behavior as a function of temperature measured at 100 kHz for $Ba_2TiSi_2O_8$ single crystals according to an embodiment disclosed herein along the Z-axis.

FIGS. 4A and 4B show the dielectric behavior as a function of temperature measured at 100 kHz for BTS crystals along X- and Z-axis, respectively. As shown in FIG. 4A, the dielectric constant $\in_{11}^T/\in_0$ was found to decrease slightly from 16.5 to 15.9 with increasing temperature up to 600° C. Also, the dielectric loss, as depicted in the small inset in FIG. 4A, was found to maintain low values of less than 1% for temperatures up to 600° C. at 100 kHz. The dielectric constant $\in_{33}^T/\in_0$ as a function of temperature is shown in FIG. 4B and the small inset illustrates the dielectric loss along the Z-direction. The dielectric loss was observed to maintain low values of less than 4% up to 700° C. at 100 kHz.

Figure 5A:
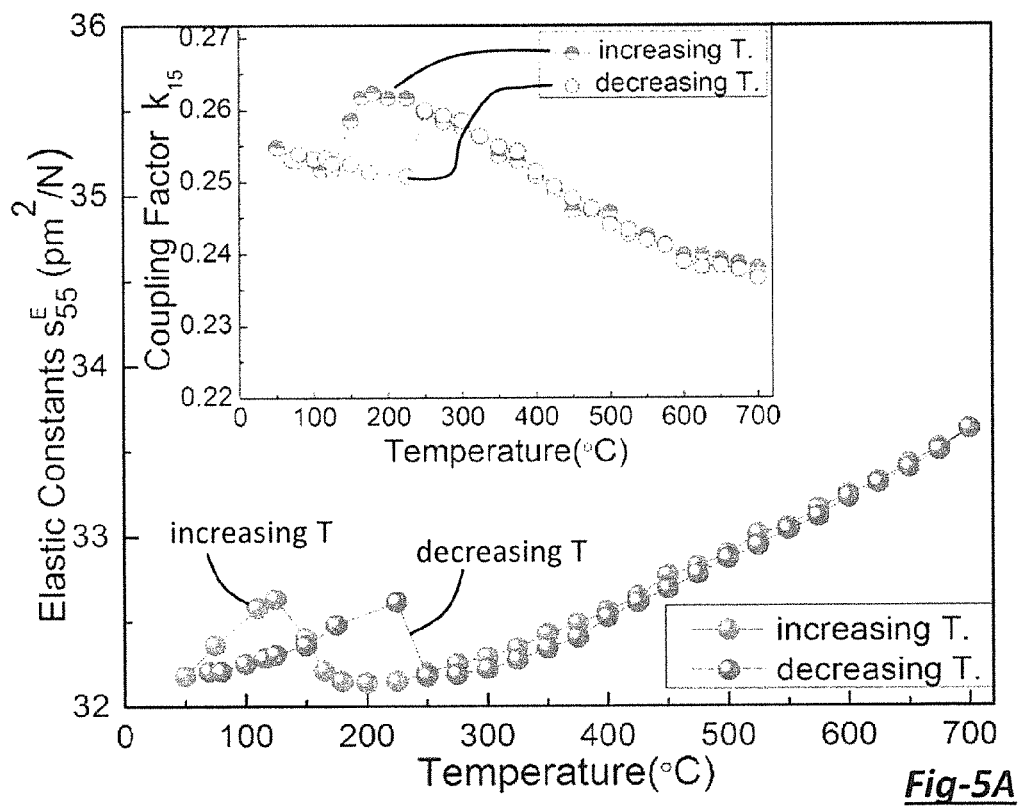
FIG. 5A is a graphical plot illustrating the elastic compliance constant $s_{55}^E$ and coupling factor $k_{15}$ as a function of temperature for $Ba_2TiSi_2O_8$ single crystals according to an embodiment disclosed herein.
Figure 5B:
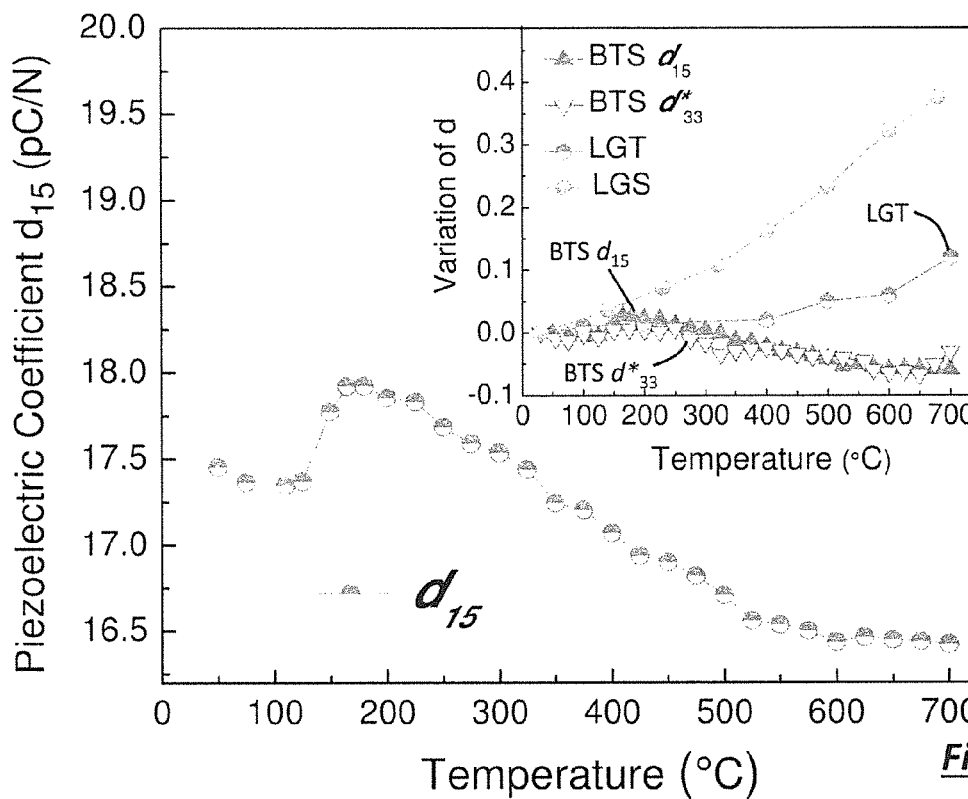
FIG. 5B is a graphical plot illustrating the piezoelectric coefficient $d_{15}$ for $Ba_2TiSi_2O_8$ single crystals according to an embodiment disclosed herein versus temperature and a variation of piezoelectric coefficients of $Ba_2TiSi_2O_8$ single crystals according to an embodiment disclosed herein and compared to LGY and LGS crystals as a function of temperature.

The temperature dependence of the various electromechanical properties, including the elastic compliance constant $s_{55}^E$, coupling factor $k_{15}$ and piezoelectric coefficient $d_{15}$ are shown in FIGS. 5A and 5B. In particular, FIG. 5A illustrates that the elastic constant $s_{55}^E$ was found to increase linearly with increasing temperature from 32.2 to 33.8 $pm^2/N$, with a small anomaly peak being observed at low temperatures and associated with a commensurate-incommensurate phase transition. The electromechanical coupling factor $k_{15}$ as a function of temperature is shown in the inset of FIG. 5A and was found to be 25.5% at room temperature, slightly decreased to 23.8% at 700° C., and had a total variation of less than 7%.

FIG. 5B presents the piezoelectric coefficient $d_{15}$ as a function of temperature. As expected, the $d_{15}$ coefficient demonstrates a similar trend to that observed for the electromechanical coupling factor with a small anomaly near 160° C. The broad peak is associated with the anomaly peak of dielectric constant $\in_{11}^T/\in_0$, coupling factor $k_{15}$ and elastic constant $s_{55}^E$. The $d_{15}$ coefficient decreases slightly from 17.5 to 16.4 pC/N with increasing temperature from 25 to 700° C., and has an overall variation of ~6%.

The inset of FIG. 5B compares the variation of piezoelectric coefficient for BTS crystals to other high temperature piezoelectric crystals as a function of temperature. As shown in the inset graph, the variation of piezoelectric coefficient for BTS is much smaller than that of LGT and LGS crystals, and thus demonstrates a high stability in piezoelectric coefficients for high temperature usage. Without considering the anomalous peak, BTS crystals exhibit excellent piezoelectric stability over a wide temperature range.

Figure 6:
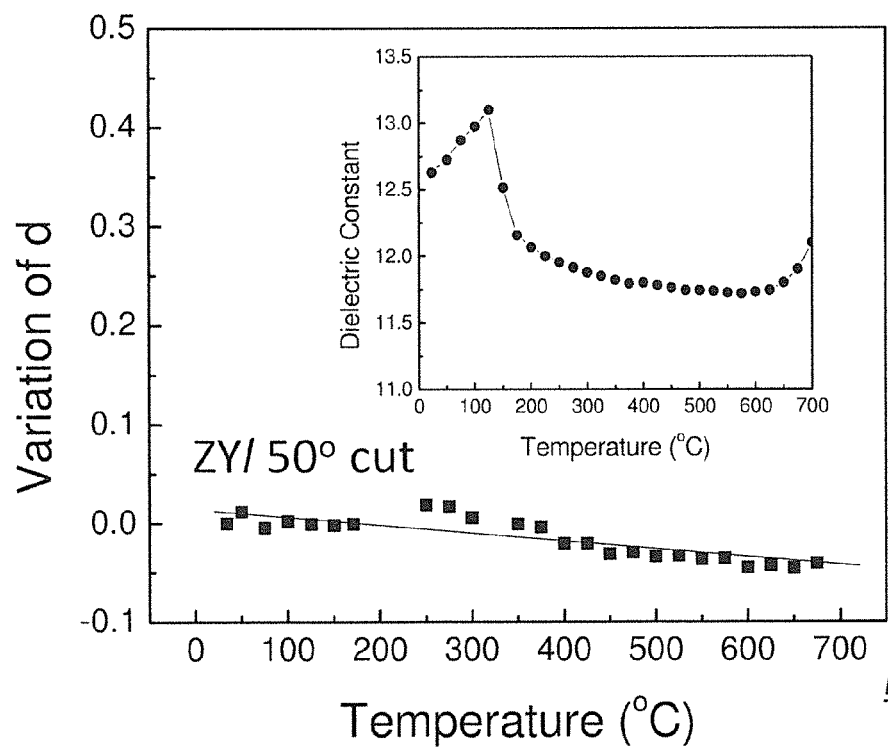
FIG. 6 is a graphical plot illustrating the longitudinal piezoelectric variation and dielectric constant variation as a function of temperature for a rotated ZY150° cut for a $Ba_2TiSi_2O_8$ single crystal according to an embodiment disclosed herein.

Turning now to FIG. 6, the longitudinal piezoelectric variation and dielectric constant (small inset) of the rotated ZYl50° crystal cut are shown. It is appreciated that minimal temperature variation (~≤5%) for the piezoelectric coefficient in the temperature range of 20-700° C. is provided by the ZYl50°-cut.

The inventive $(Sr_{2x}Ba_{2(1-x)})(Ti_yZr_{(1-y)})(Si_{2z}Ge_{2(1-z)})O_8$ crystals with Fresnoite structure are easily grown via the Czochralski method and have low raw material costs. In addition, the $(Sr_{2x}Ba_{2(1-x)})(Ti_yZr_{(1-y)})(Si_{2z}Ge_{2(1-z)})O_8$ crystals have a high temperature usage range; high electrical resistivity (>>$10^6$ Ohm·cm @600° C.); high thickness shear piezoelectric coefficient: $d_{15}$~17.5 pC/N; low dielectric loss (<1% @600° C.); high temperature independence of the thickness shear piezoelectric coefficient (<6%); and no pyroelectric effect for the thickness shear mode.

Figure 7:
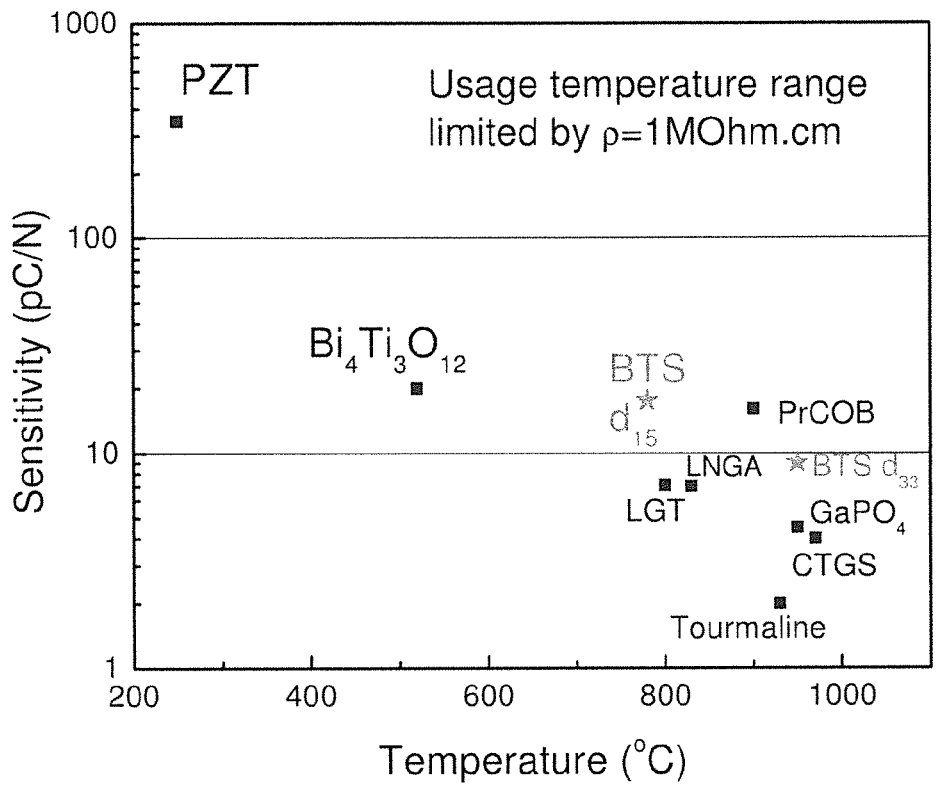
FIG. 7 is a graphical plot illustrating sensitivity of $Ba_2TiSi_2O_8$ single crystals according to an embodiment disclosed herein versus other piezoelectric materials as a function of temperature.

As such, $(Sr_{2x}Ba_{2(1-x)})(Ti_yZr_{(1-y)})(Si_{2z}Ge_{2(1-z)})O_8$ piezoelectric crystal materials can be widely used for high temperature, high performance sensors and offer many advantages over other piezoelectric crystals, as shown in FIG. 7. For example, compared to ferroelectric ceramics (including perovskite and Aurivillius structured materials) and ferroelectric lithium niobate, the fresnoite type piezocrystals have no ferroelectric phase transition, thereby expanding their temperature usage greatly. Compared to langasite crystals (e.g. LGS & LGT), the fresnoite crystals show high electrical resistivity and piezoelectric sensitivity. The thickness shear piezoelectric coefficient $d_{15}$ can be around 17.5 pC/N or higher, and exhibit no cross-talk from other piezoelectric vibrations and no pyroelectric effect. In addition, the longitudinal piezoelectric coefficients $d_{33}$, achieved from Z-cut crystals and/or rotated crystal cuts are useful for compression sensing applications.

Figure 8A:
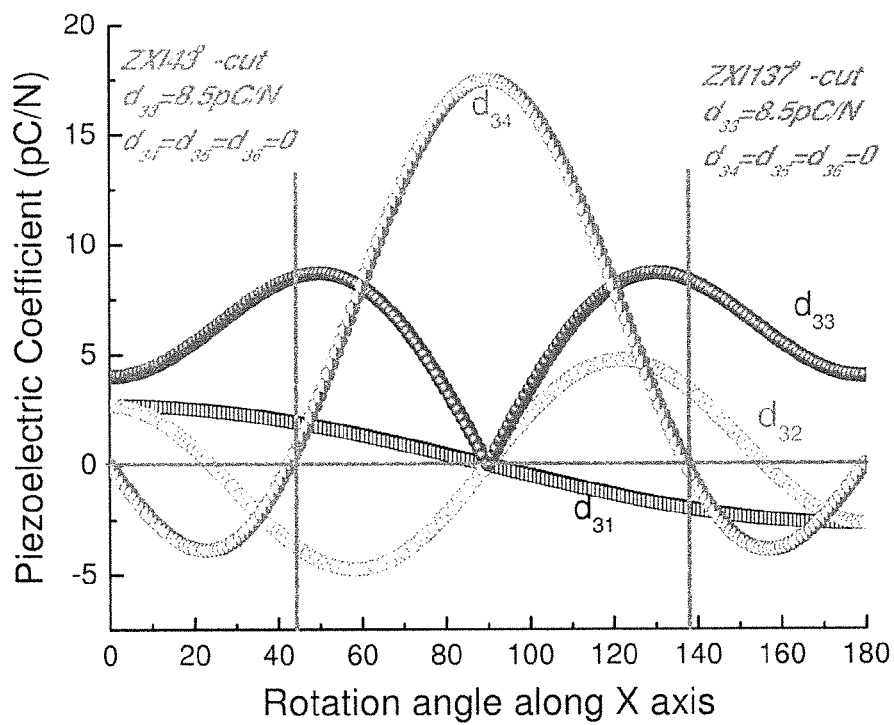
FIG. 8A is a graphical plot of piezoelectric coefficients versus rotation angle along the X-axis for a ZX143°/ZXl137° cut for a piezoelectric element disclosed herein.
Figure 8B:
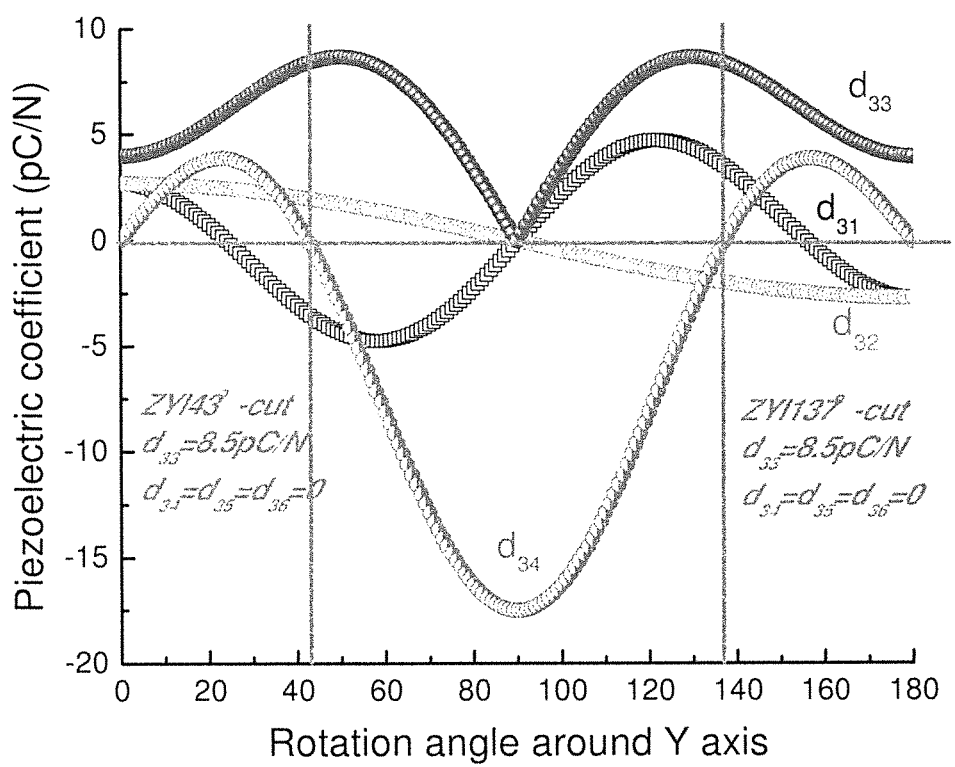
FIG. 8B is a graphical plot of piezoelectric coefficients versus rotation angle along the Y-axis for a ZX143°/ZXl137° cut for a piezoelectric element disclosed herein.

With respect to reducing and/or minimizing cross-talk for an inventive piezoelectric device, specific crystal cuts with much reduced cross-talk from other piezoelectric vibration modes are provided. For example, and as illustrated in FIGS. 8A and 8B, the ZXl43°/ZXl137° cut and/or ZYl43°/ZYl137° cut of a BTS single crystal possess a high piezoelectric coefficient of $d_{33}$—being approximately 8.5 pC/N which is close to its maximized value of 8.7 pC/N—but have approximate zero face shear/thickness shear vibration modes $d_{34}$, $d_{35}$ and $d_{36}$. As such, a significant decrease in the interferences between such modes is provided. In addition, such optimized crystal cuts exhibit thermal stability of the piezoelectric properties up to 700° C. Also, for the purposes of the instant disclosure, the term "approximate" and "approximately" used above refers to +/−0.5 pC/N.

Given the above, and the high resistivity and piezoelectric coefficients at elevated temperatures exhibited by the $(Sr_{2x}Ba_{2(1-x)}Ti_yZr_{(1-y)})(Si_{2z}Ge_{2(1-z)})O_8$ piezoelectric crystal materials, high temperature devices using such a piezoelectric element can be used for health monitoring of engines in the aerospace, aircraft and automotive industries, and in furnace components for power generation plants is provided.

The examples and embodiments discussed above are provided for illustrative and teaching purposes only and thus are not meant to and do not limit the invention in any way.

Changes, modifications and the like to the examples, embodiments, etc., discussed above can be made by those skilled in the art and still fall within the scope of the invention. It is the claims, and all equivalents thereof, that define the scope of the invention.

We claim:

1. A high temperature piezoelectric sensor device for use at temperatures up to 1000° C., said device comprising:
    a base;
    a piezoelectric element attached to said base, wherein said piezoelectric element is a single crystal having a chemical stoichiometry of $A_2BC_2O_8$ with A equal to at least one of Ca, Sr, Ba, Mg; B equal to at least one of Ti, Zr, Hf, V; and C equal to at least one of Si, Ge, Sn;
    a pair of electrodes in electrical communication with said piezoelectric element;
    said piezoelectric element having a rotated $d_{33}$ piezoelectric coefficient between 8.0-9.5 pC/N and a variation less than 5% for all temperatures between 25 to 700° C.

2. The high temperature device of claim 1, wherein the piezoelectric crystal is $Ba_2TiSi_2O_8$.

3. The high temperature device of claim 2, wherein said single crystal has a Z-axis electrical resistivity greater than $1.0 \times 10^9$ Ω·cm at 600° C.

4. The high temperature device of claim 2, wherein said piezoelectric device has a ZX143°/ZX1137° cut or a ZY143°/ZY1137° cut with a $d_{33}$ piezoelectric coefficient of approximately 8.5 pC/N and $d_{34}$, $d_{35}$ and $d_{36}$ piezoelectric coefficients of 0.0.

5. The high temperature device of claim 2, wherein said piezoelectric element has a dielectric loss along a rotated Z-axis of less than 4% for temperatures between 25 to 700° C. at a frequency of 100 kHz.

6. A high temperature device for use at temperatures up to 1000° C., said device comprising:
  a base;
  a piezoelectric element attached to said base, said piezoelectric element being a single crystal having a chemical stoichiometry of $A_2BC_2O_8$ with A equal to at least one of Ca, Sr, Ba, Mg; B equal to at least one of Ti, Zr, Hf, V; and C equal to at least one of Si, Ge, Sn;
  a pair of electrodes in electrical communication with said piezoelectric element;
  said piezoelectric element having a $d_{15}$ piezoelectric coefficient between 16.0-18.0 pC/N for all temperatures between 25 to 700° C.

7. The high temperature device of claim 6, wherein the piezoelectric crystal is $Ba_2TiSi_2O_8$.

8. The high temperature device of claim 7, wherein said single crystal has an X-axis electrical resistivity greater than $1.0 \times 10^7$ Ω·cm at 600° C.

9. The high temperature device of claim 7, wherein said piezoelectric element has a dielectric loss along an X-axis of less than 1% for temperatures between 25 to 600° C. at a frequency of 100 kHz.

* * * * *